(12) United States Patent
Gasanov et al.

(10) Patent No.: US 7,823,050 B2
(45) Date of Patent: Oct. 26, 2010

(54) LOW AREA ARCHITECTURE IN BCH DECODER

(75) Inventors: Elyar E. Gasanov, Moscow (RU); Alexander Andreev, San Jose, CA (US); Ilya V. Neznanov, Moscow (RU); Pavel A. Panteleev, Moscow (RU); Sergei Gashkov, Moscow (RU)

(73) Assignee: LSI Corporation, Milpitas, CA (US)

( * ) Notice: Subject to any disclaimer, the term of this patent is extended or adjusted under 35 U.S.C. 154(b) by 979 days.

(21) Appl. No.: 11/613,529

(22) Filed: Dec. 20, 2006

(65) Prior Publication Data

US 2008/0155381 A1 Jun. 26, 2008

(51) Int. Cl.
*H03M 13/00* (2006.01)

(52) U.S. Cl. ............... 714/782; 714/752; 714/758; 714/781

(58) Field of Classification Search ............... 714/752, 714/758, 781–785
See application file for complete search history.

(56) References Cited

U.S. PATENT DOCUMENTS 5,323,402 A * 6/1994 Vaccaro et al. ............... 714/782

7,467,346 B2 * 12/2008 Hassner et al. ............... 714/781

OTHER PUBLICATIONS

Kang et al., "A high-speed and low-latency Reed-Solomon decoder based on a dual-line structure," IEEE Intern., vol. 3, pp. 3180-3183, (2002).

Sarwate et al., "High-speed architectures for Reed-Solomon decoders," IEEE transactions on VLSI Systems, vol. 1, No. 5, pp. 641-655, (2001).

Burton, "Inversionless Decoding of Binary BCH Codes," IEEE Transactions on Information Theory, vol. IT-17, No. 4, pp. 464-466, (1971).

* cited by examiner

*Primary Examiner*—Sam Rizk
(74) *Attorney, Agent, or Firm*—Luedeka, Neely & Graham, P.C.

(57) ABSTRACT

An improvement to a key equation solver block for a BCH decoder, where the key equation solver block having a number of multiplier units specified by X, where: $t*(7*t-1)/(codeword\_len-3) \leq X < (t+1)$, where t is a number of transmission errors for the key equation solver block to correct, and codeword_len is a length of a transmitted codeword to be decoded by the BCH decoder.

1 Claim, 5 Drawing Sheets

Block $B_i$, $i=1,2,\ldots,n-1$ ($q=1$ for $i=1,2,\ldots,l-1$)

Block $M_0$

Block $M_i$, $i=1,2,\ldots,t-2$

LOW AREA ARCHITECTURE IN BCH DECODER

FIELD

This invention relates to the field of integrated circuits. More particularly, this invention relates to error correcting codes, such as those used during the transmission of digital information.

BACKGROUND

BCH (Bose-Chaudhuri-Hocquenghem) codes are a large class of multiple error-correcting codes. The binary BCH codes were discovered in 1959 by Hocquenghem and independently in 1960 by Bose and Ray-Chaudhuri. Later, Gorenstein and Zierler generalized them to all finite fields. At about the same time Reed and Solomon published their paper on the special case of BCH codes that now bear their names.

In practice, the binary BCH and Reed-Solomon codes are the most commonly used variants of BCH codes. They have applications in a variety of communication systems: space communication links, digital subscriber loops, wireless systems, networking communications, and magnetic and data storage systems. Continual demand for ever higher data rates and storage capacity provide an incentive to devise very high-speed and space-efficient VLSI implementations of BCH decoders. The first decoding algorithm for binary BCH codes was devised by Peterson in 1960. Since then, Peterson's algorithm has been refined by Gorenstein and Zierler, Berlekamp, Massey, Chien, Forney, and many others.

BCH codes are generally developed as follows. GF(q) is defined as a finite field of q elements, $q=2^s$, called the base field, and $\alpha$ is defined as a primitive element of extension field $GF(q^m)$, where $n|q^m-1$. The variable t is defined as an error detecting BCH code of length n over GF(q) as the set of all sequences $(c_0, c_1, \ldots, c_{n-1})$, $c_i \in GF(q)$ such that polynomial $$c(x)=c_0+c_1x+\ldots+c_{n-1}x^{n-1} \in GF(q^m)[x]$$

has roots in points: $\alpha^1, \alpha^2, \ldots, \alpha^{2t}$. The BCH code with m=1 is called the Reed Solomon code, and the BCH code with s=1 is called the binary BCH code.

Encoding of BCH Codes

First, we calculate the generator polynomial $g(x) \in GF(q)$:

$$g(x)=(x-\alpha)(x-\alpha^2)\ldots(x-\alpha^{2t})=LCM\{M_1(x), M_2(x), \ldots, M_{2t}(x)\},$$

where LCM is the least common multiplier and $M_i(x)$ is the minimal polynomial for $\alpha^i$. Let $(d_0, d_1, \ldots, d_{k-1})$ denote k data symbols that are to be transmitted over a communication channel, and $d(x)=d_0+d_1x+\ldots d_{k-1}x^{k-1} \in GF(q)[x]$. The systematic encoding of vector $(d_0, d_1, \ldots, d_{k-1})$ into a codeword $(c_0, c_1, \ldots, c_{n-1})$ is as follows:

$$c(x)=x^{n-p}d(x)+t(x),$$

where p=deg g(x) and $t(x)=-x^{n-p}d(x) \bmod g(x)$, $c(x)=c_0+c_1x+\ldots+C_{n-1}x^{n-1}$.

Decoding of BCH Codes

There are many BCH decoder architectures. A typical BCH decoder works as follows. Let $(c_0, c_1, \ldots, C_{n-1})$ be a transmitted codeword and $(e_0, e_1, \ldots, e_{n-1})$ be an error vector in a communication channel, where in r (with $r \leq t$) positions $i_1, i_2, \ldots, i_r$ there are non-zero values $Y_1=e_{i_1}, \ldots, Y_r=e_{i_r}$. Let also $X_1=\alpha^{i_1}, \ldots, X_r=\alpha^{i_r}$. Define $e(x)=e_0+e_1x+\ldots+e_{n-1}x^{n-1}$ and $t(x)=c(x)+e(x)$, $t(x)=t_0+t_1x+\ldots+t_{n-1}x^{n-1}$, where $(t_0, t_1, \ldots, t_{n-1})$ is a word is to be decoded. Then, the decoding algorithm consists of three main steps:

1. Syndrome Computation Block

The decoder begins by computing 2t syndrome values $$S_0=c(\alpha), S_1=c(\alpha^2), \ldots, S_{2t-1}=c(\alpha^{2t})$$

2. Key Equation Solver Block

This block is perhaps the most intricate part of BCH decoder. Define the syndrome polynomial S(x), error locator polynomial $\Lambda(x)$, and error evaluator polynomial $\Omega(x)$ as follows:

$$S(x) = S_0 + S_1 x + \ldots + S_{2t-1} x^{2t-1},$$

$$\Lambda(x) = \Lambda_0 + \Lambda_1 x + \ldots + \Lambda_r x^r = \sum_{i=1}^{r}(1-X_i x),$$

$$\Omega(x) = \Omega_0 + \Omega_1 x + \ldots + \Omega_{r-1} x^{r-1} = \sum_{i=1}^{r} Y_i X_i \prod_{j=1, j \neq i}^{r}(1-X_j x)$$

It is well known that these three polynomials are related with the following key equation:

$$\Lambda(x)S(x)=\Omega(x) \bmod x^{2t}$$

There are two major methods for solving the key equation: first, the Berlekamp-Massey algorithm (BM), and second, the extended Euclidean algorithm (eE). Until recently the architectures based on the eE algorithm were more popular because of its simplicity and regularity. In addition, they had smaller critical path delays then architectures based on the BM algorithm. Lately, however, BM based architectures have gained in popularity, due to a number of modifications in the standard BM algorithm that have made them even faster and more space-efficient than the eE based architectures.

3. Chien/Forney Block

The last block finds the positions of the errors, and corrects the errors using the Forney formula:

For all $i \in \{0, 1, \ldots, n-1\}$:

if $\Lambda(\alpha^{-i}) = 0$ then $t_i := t_i + \dfrac{\Omega(\alpha^{-i})}{\Lambda'(\alpha^{-i})}$ else we don't change $t_i$.

What is desired is a scalable architecture for the BM algorithm.

SUMMARY

The above and other needs are met by an improvement to a key equation solver block for a BCH decoder, where the key equation solver block having a number of multiplier units specified by X, where:

$$t*(7*t-1)/(\text{codeword\_len}-3) \leq X < (t+1),$$

where t is a number of transmission errors for the key equation solver block to correct, and codeword_len is a length of a transmitted codeword to be decoded by the BCH decoder.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
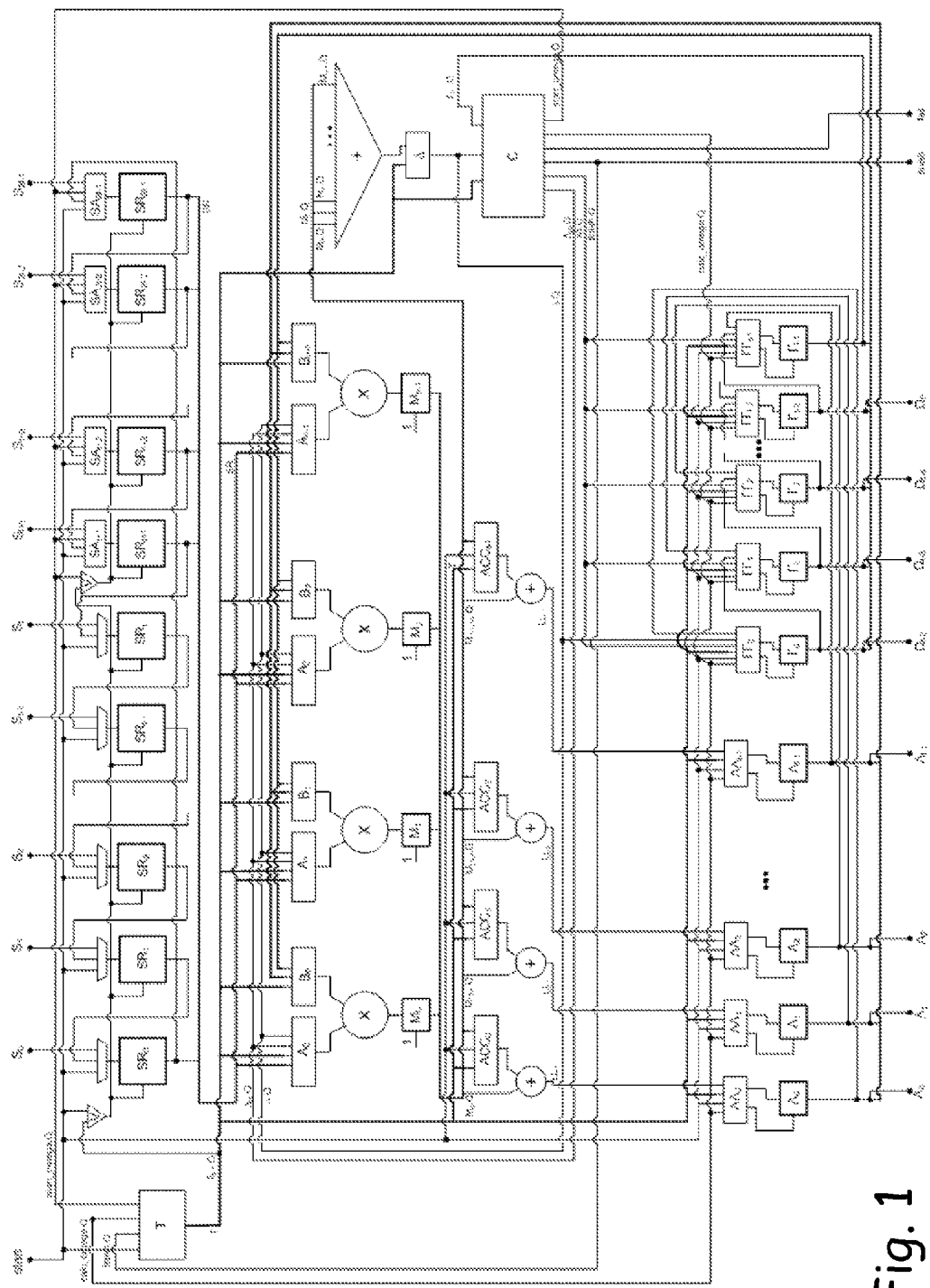
FIG. 1 is a functional block diagram of a key equation solver block according to one embodiment of the present invention.

Multiplication in Galois fields is one of the most expensive operations in terms of the design area that is occupies on integrated circuits. For this reason, reducing the number of multipliers generally leads to a significant decrease in the amount of design area required.

In the embodiments of the key equation solver (KES) block according to the present invention, the number of clock cycles of service of one codeword depends on the number of multipliers, according to the following relationship: $N = t*(7*t-1)/\text{mult\_num}+3$, where N is the number of clock cycles of service of one codeword, t is the number of errors to be corrected, and mult_num is the number of multipliers in the KES block. Hence, when the number of multipliers is reduced, the number of clock cycles generally increases.

For a pipeline decoder according to the present invention, the number of clock cycles of service for one codeword by the KES block is preferably no greater than the codeword length. As a result, the formula for the minimal acceptable number of multipliers for the pipeline decoder can be obtained as: $\text{min\_mult\_num} = t*(7*t-1)/(\text{codeword\_len}-3)$, where min_mult_num is the minimal acceptable number of multipliers for the pipeline decoder, t is the number of errors to correct, and codeword_len is the codeword length.

In a standard KES block, usually 2t or (t+1) multipliers are used. In the KES blocks according to the present invention, any number of multipliers can be used. The architecture of KES blocks according to the present invention preferably has a variable number of multipliers that is dependent, at least in part, on codeword lengths.

Key Equation Solver Block with Variable Number of Multipliers

The key equation solver block proposed herein is termed an inversionless Berlekamp-Massey algorithm (iBM). The embodiment of the key equation solver block described in this section depends on two parameters. First, parameter t is the number of errors to correct. If the number of errors to correct is more than or equal to t, then the key equation solver block returns a fail code. The second parameter k defines the number of multipliers. The number of multipliers is equal to $n=]t/k[$. Here $]x[$ is a minimal integer number such that $]x[\geq x$. The inputs of the key equation solver block are 2t syndrome values: $S_0, S_1, \ldots, S_{2t-1}$. The output of the key equation solver block are t coefficients of the error locator polynomial: $\Lambda_0, \Lambda_1, \ldots, \Lambda_{t-1}$, and t-1 coefficients of the error evaluator polynomial: $\Omega_0, \Omega_1, \ldots, \Omega_{t-2}$.

DEFINITIONS

If R is a register then RD is the data input to the register, RE is the enable input to the register, and RQ is the output of the register. If for the r clock cycle RD=A and RE=1, then for the r+1 clock cycle RQ=A. If for the r clock cycle RD=A, RQ=B, and RE=0, then for the r+1 clock cycle RQ=B. Denote by $\oplus$ and $\cdot$ sum and multiplication operations in the finite field, respectively.

Structure

The key equation solver block according to the embodiment described in this section uses the following registers:
1) $SR_0, SR_1, \ldots, SR_{2t-1}$ to save syndrome values,
2) $\Lambda_0, \Lambda_1, \ldots, \Lambda_{t-1}$ to save coefficients of the error locator polynomial,
3) L to save the degree of the error locator polynomial,
4) r to save the step index,
5) $\Xi_0, \Xi_1, \ldots, \Xi_{t-1}$,
6) $\Gamma_0, \Gamma_1, \ldots, \Gamma_{t-1}$,
7) $\Delta_{pr}$,
8) $\Delta$, and
9) $\delta$

Initialization

The key equation solver block according to this embodiment is initiated with the following values:
1) $SR_0.D=S_0, SR_1.D=S_1, \ldots, SR_{t-1}.D=S_{t-1}$;
1) $\Lambda_0.D=1, \Lambda_1.D=0, \ldots, \Lambda_{t-1}.D=0$;
2) $\Gamma_0.D=1, \Gamma_1.D=0, \ldots, \Gamma_{t-1}.D=0$;
3) $\Delta pr=1$;
3) L=0; and
4) r=0.

Process

The key equation solver block according to this embodiment consists of two main steps:
1) Computation of the coefficients of the error locator polynomial; and
2) Computation of the coefficients of the error evaluator polynomial.

The computation of the coefficients of the error locator polynomial consists of 2t elementary steps. The $q^{th}$ elementary step consists of 3k clock cycles:

1) $\Delta.D = \bigoplus_{j=0}^{n-1} \Lambda_j.Q \cdot SR_{r \cdot Q-j} \cdot Q$ (remember $n = ]t/k[$ is the number of multipliers).

2) $\Delta.D = \Delta.Q \oplus \bigoplus_{j=n}^{2n-1} \Lambda_j.Q \cdot SR_{r \cdot Q-j}.Q$.

...

k) $\Delta.D = \Delta.Q \oplus \bigoplus_{j=n(k-1)}^{t-1} \Lambda_j.D \cdot SR_{r \cdot Q-j}.D$.

k + 1) Define $\delta$:

if $\Delta.Q \neq 0$ and $2L.Q \leq r.Q$ then $\delta.D = 1$ else $\delta.D = 0$;

$\Xi_j.D = \Delta_{pr}.Q \cdot \Lambda_j.Q; j = 0, 1, \ldots, n-1$.

k + 2) $\Xi_j.D = \Delta_{pr}.Q \cdot \Lambda_j.Q; j = n, n+1, \ldots, 2n-1$.

...

2k) $\Xi_j.D = \Delta_{pr}.Q \cdot \Lambda_j.Q, j = n(k-1), n(k-1)+1, \ldots, t-1$.

2k + 1) if $\delta.Q \neq 0$ then $\Gamma_j.D = \Lambda_j.Q$;

$\Lambda_j.D = \Xi_j.D \oplus \Delta.Q \cdot \Gamma_{j-1}.Q; j = 0, 1, \ldots, n-1$.

-continued

3k – 1) if $\delta.Q \neq 0$ then $\Gamma_j.D = \Lambda_j.Q$;

$\Lambda_j.D = \Xi_j.D \oplus \Delta.Q \cdot \Gamma_{j-1}.Q$;

$j = n(k-2), n(k-2)+1, \ldots, n(k-1)-1$.

3k) $\Lambda_j.D = \Xi_j.D \oplus \Delta.Q \cdot \Gamma_{j-1}.Q$, $j = n(k-1), n(k-1)+1, \ldots, t-1$;

if $\delta.Q \neq 0$ then $\Gamma_j.D = \Lambda_j.Q$, $j = n(k-1), n(k-1)+1, \ldots, t-1$;

otherwise $\Gamma_0.D = 0, \Gamma_j.D = \Gamma_{j-1}.Q, j = 1, 2, \ldots, t-1$;

if $\delta.Q \neq 0$ then $L.D = r.Q + 1 - L.Q$ and $\Delta_{pr}.D = \Delta.Q$.

If after $2t$ elementary steps $L.Q \geq t$ then the key equation solver block returns a "fail" indication.

The computation of the coefficients of the error evaluator polynomial consists of $t-1$ elementary steps.

The $q^{th}$ elementary step consists of k clock cycles:

1) $\Delta.D = \bigoplus_{j=0}^{n-1} \Lambda_j.Q \cdot SR_{r \cdot Q - j}.Q$.

2) $\Delta.D = \Delta.Q \oplus \bigoplus_{j=n}^{2n-1} \Lambda_j.Q \cdot SR_{r \cdot Q - j}.Q$.

...

k – 1) $\Delta.D = \Delta.Q \oplus \bigoplus_{j=n(k-2)}^{n(k-1)-1} \Lambda_j.Q \cdot SR_{r \cdot Q - j}.D$.

k) $\Omega_q = \Delta.Q \oplus \bigoplus_{j=n(k-1)}^{t-1} \Lambda_j.D \cdot SR_{r \cdot Q - j}.D$.

Key Equation Solver Block Description

If R is a register and RE is not assigned, then RE is assumed to be one.

Interface and Registers

Inputs
1. $S_0, S_1, S_{2t-1}$ are syndrome values.
2. start is a start signal.

Outputs
1. $\Lambda_0, \Lambda_1, \Lambda_{t-1}$ are coefficients of the error locator polynomial.
2. $\Omega_0, \Omega_1, \ldots, \Omega_{t-2}$ are coefficients of the error evaluator polynomial.
3. finish is a finish signal.
4. fail is a fail signal.

Constants
1. n=]t/k[.
2. m=3*k.
3. l=t mod n.
4. if l=0 then q=], otherwise q=2.

Registers
1. $SR_0, SR_1, \ldots, SR_{2t-1}$ are syndrome registers.
2. $\Lambda_0, \Lambda_1, \ldots, \Lambda_{t-1}$, are registers for the error locator polynomial coefficients.
3. finish is the finish signal register.
4. fail is the fail signal register.
5. L is the register to save the degree of the error locator polynomial.
6. r is a register to save the step index.
7. $\Xi_0, \Xi_1, \ldots, \Xi_{t-1}$.
8. $\Gamma_0, \Gamma_1, \ldots, \Gamma_{t-1}$.
9. $T_0, T_1, \ldots, T_{m-1}$ are clock registers for the error locator polynomial calculation.
10. $T_0', T_1', T_{k-1}'$ are clock registers for the error evaluator polynomial calculation.
11. $M_0, M_1, \ldots, M_{n-1}$ are output registers for the multipliers.
12. $\Delta_{pr}$.
13. $\Delta$.
14. $\Delta_0$.
15. start_omega.
16. calc_omega.
17. $L_r$.
18. $r\delta$.
19. after_start.

Internal Wires
1. $A_0, A_1, \ldots, A_{n-1}$; $B_0, B_1, \ldots, B_{n-1}$ are inputs for the multipliers.
2. $LL_0, LL_1, \ldots, LL_{t-1}$.
3. $\delta$.
4. sum.
5. sum_control.

Computations

1. $T_0.D = \text{start} \vee \neg \text{finish}.Q \& MUX(\text{calc\_omega}Q,$ $T_{m-1}.Q, T_{k-1}.Q)$;

$T_k.D = \neg \text{start} \& \neg \text{finish}.Q \&$ $\neg \text{calc\_omega}Q \& T_{k-1}.Q$;

$T_i.D = \neg \text{start} \& \neg \text{finish}.Q \& T_{i-1}.Q$, $i = 1, 2, \ldots, k-1, k+1, \ldots, m-1$;

$T_0'.D = \neg \text{start\_omega}Q \& \neg \text{finish}.Q \& T_{k-1}'.Q$;

$T_{k-2}' = \text{start\_omega}Q \vee (\neg \text{finish}.Q \& T_{k-3}'.Q)$;

$T_i'.D = \neg \text{start\_omega}Q \& \neg \text{finish}.Q \& T_{i-1}'.Q$;

$i = 1, 2, \ldots, k-3, k-1$.

2. $SR_i D = MUX(\text{start}, SR_{i+1}.Q, S_i)$, $SR_i.E = \text{start} \vee T_{k-1}.Q, i = 0, 1, 1 \ldots 1, r$;

$SR_i D = MUX(\text{start}, \neg \text{start\_omega}Q \& SR_{(i+1) \bmod (2t)}.Q, S_i)$, $SR_i, E = \text{start} \vee T_{k-1}.Q \vee \text{start\_omega}Q, i = t+1, \ldots, 2t-1$.

3. $A_i = (T_0.Q \& SR_{(2t-i) \bmod (2t)}.Q \vee T_1.Q \& SR_{(2t-n-i)}.Q \vee \ldots \vee$ $T_{k-1}.Q \& SR_{(2t-(k-1)n-i)}.Q) \vee (T_k.Q \vee \ldots \vee T_{2k-1}.Q) \& \Delta_{pr}.Q \vee$ $(T_{2k}.Q \vee \ldots \vee T_{3k-1}.Q) \& \Delta.Q, i = 0, 1, \ldots, l-1$;

$A_i = (T_0.Q \& SR_{(2t-i) \bmod (2t)}.Q \vee T_1 Q \& SR_{(2t-n-i)}.Q \vee \ldots \vee$ $T_{k-q}.Q \& SR_{(2t-(k-q)n-i)}.Q) \vee (T_k.Q \vee \ldots \vee T_{k-1}.Q) \& \Delta_{pr}.Q \vee$ $(T_{2k}.Q \vee \ldots \vee T_{3k-1}.Q) \& \Delta.Q, i = l, l+1, \ldots, n-1$.

Figure 2:
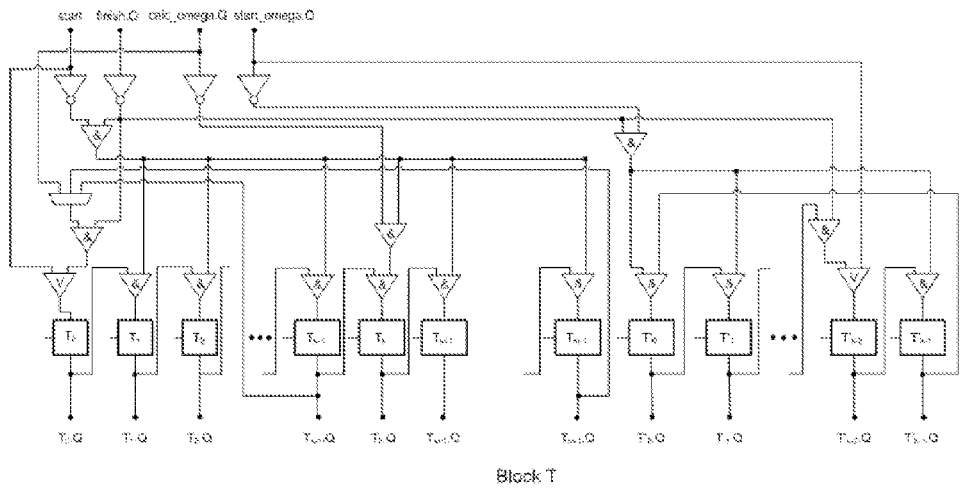
FIGS. 2-8 depict additional detail for the functional units depicted in FIG. 1, according to one embodiment of the present invention.
Figure 4:
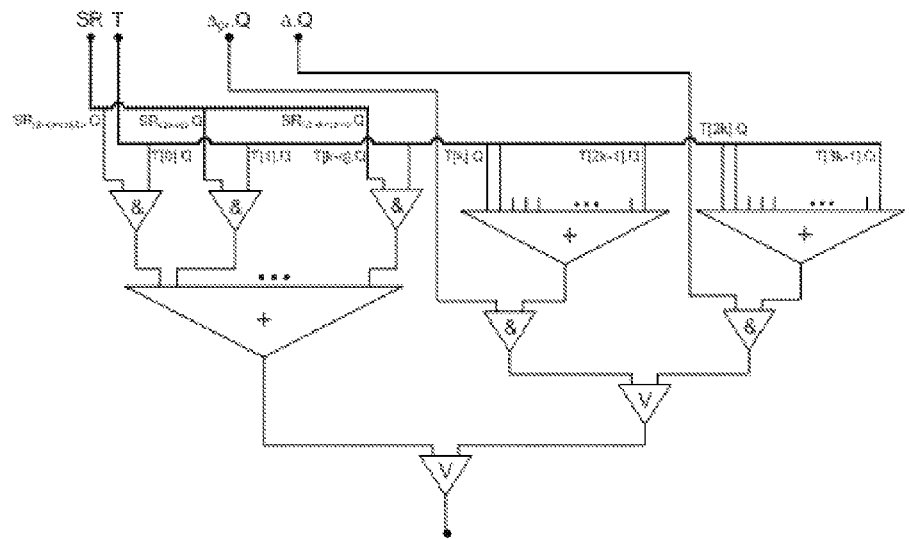
Figure 5:
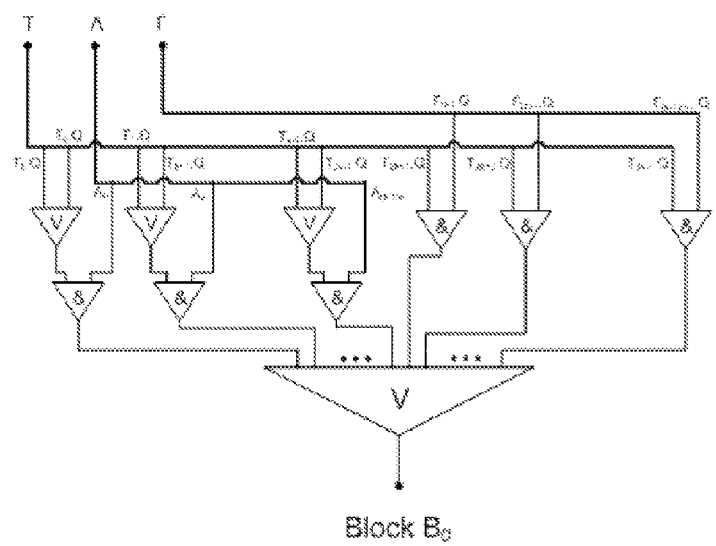
Figure 6:
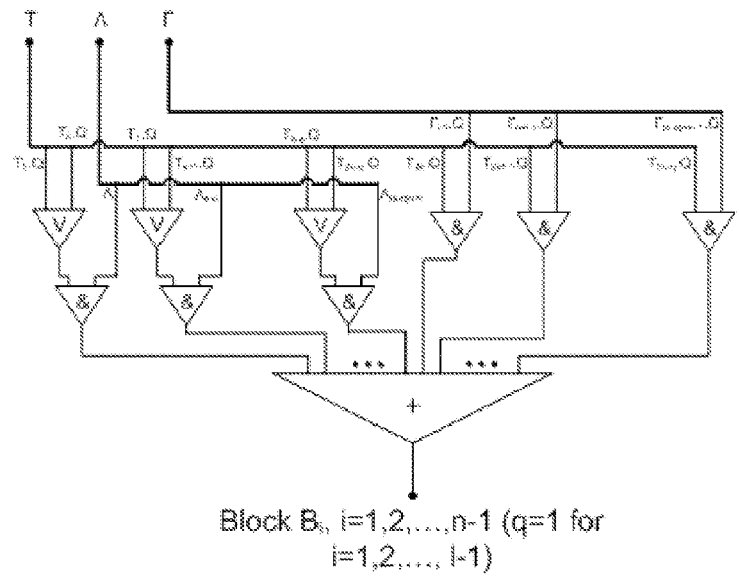
Figure 7A:
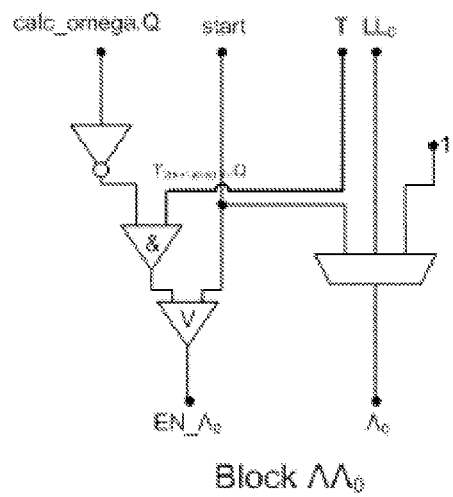
Figure 7B:
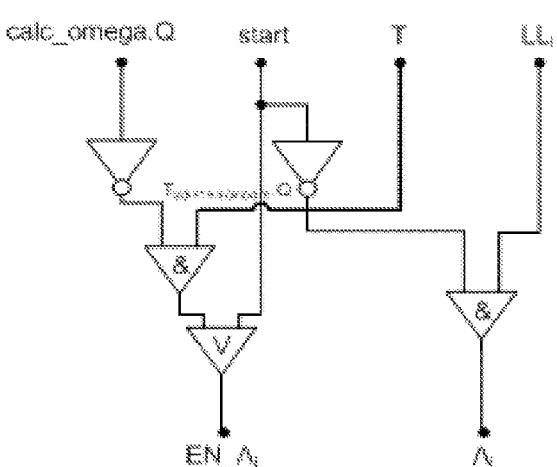
Figure 7C:
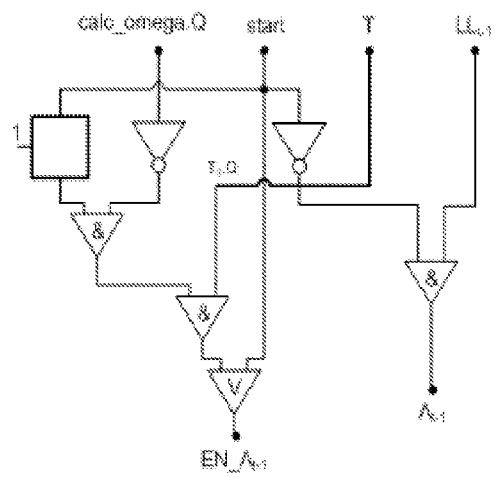
Figure 8A:
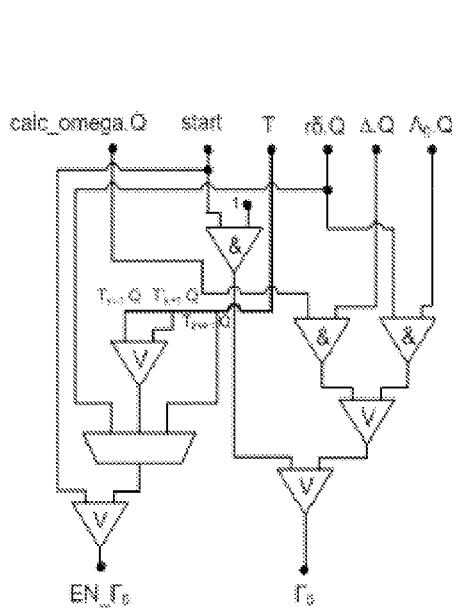
Figure 8B:
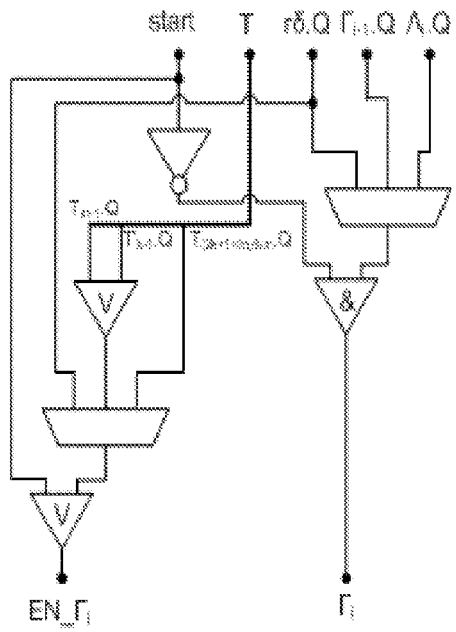

4. $B_0 = ((T_0.Q \vee T_k.Q) \& \Lambda_0 \vee (T_1 \cdot Q \vee T_{k+1}.Q) \& \Lambda_n \vee \ldots \vee$ $(T_{k-1}.Q \vee T_{2k-1}.Q) \& \Lambda_{(k-1)n})) \vee (T_{2k+1}.Q \& \Gamma_{n-1}.Q \vee T_{2k+2}.Q \&$ $\Gamma_{2n-1}.Q \vee \ldots \vee T_{3k-1}.Q \& \Gamma_{(k-1)n-1}.Q)$;

-continued $B_i = ((T_0.Q \vee T_k.Q) \&\Lambda_i \vee (T_1.Q \vee T_{k-1}.Q) \&\Lambda_{n+i} \vee \ldots \vee$ $(T_{k-1}.Q \vee T_{2k-1}.Q) \&\Lambda_{(k-1)n-1})) \vee (T_{2k}.Q \&\Gamma_{i-1}.Q \vee T_{2k+1}.Q \&$ $\Gamma_{n+i-1}.Q \vee \ldots \vee T_{3k-1}.Q \&\Gamma_{(k-1)n+i-1}.Q), i = 1, 2, \ldots, l-1;$ $B_i = ((T_0.Q \vee T_k.Q) \&\Lambda_i \vee (T_1.Q \vee T_{k+1}.Q) \&\Lambda_{n+i} \vee \ldots \vee$ $(T_{k-q}.Q \vee T_{2k-q}.Q) \&\Lambda_{(k-q)n+i})) \vee (T_{2k}.Q \&\Gamma_{i-1}.Q \vee T_{2k+1}.Q \&$ $\Gamma_{n+i-1}.Q \vee \ldots \vee T_{3k-q}.Q \&\Gamma_{(k-q)n+i-1}.Q,$ $i = \max(1, l), \ldots, n-1.$ 5. $M_i.D = A_i \cdot B_i, i = 0, 1, \ldots, n-1.$ 6. $\text{sum} = \bigoplus_{j=0}^{n-1} M_i.Q.$ 7. $\text{sum\_control} = T_0.Q \vee T_2.Q \vee \ldots \vee T_k.Q.$ 8. $\Delta.D = \text{sum} + (\Delta.Q \&\text{sum\_control});$ $\Delta.E = T_1.Q \vee \text{sum\_control}.$ 9. $\Delta_0.D = (\Delta.Q \neq 0); \Delta_0.E = T_{k+1}.Q.$ 10. $L_r.D = (2L.Q \leq r.Q) \& T_{k-1}.Q.$ 11. $\delta = L_r.Q \&\Delta_0.Q \&\neg \text{calc\_omega}.Q.$ 12. $r\delta.D = \delta; r\delta.E = T_{k+2}.Q.$ 13. $\Delta_{pr}.D = (\text{start } \&1) \vee \Delta.Q;$ $\Delta_{pr}.E = \text{start} \vee (r\delta.Q \& T_{2k-1}.Q).$ 14. $L.D = \neg \text{start } \&(r.Q + 1 - L.Q); L.E = \text{start} \vee \delta.$ 15. $\Xi_i, D = \neg \text{start } \& M_{i \bmod n}.Q, \Xi_i.E = \text{start} \vee T_{k+1+i/n}.Q,$ $i = 0, 1, \ldots, t-1.$ 16. $\Gamma_0.D = (\text{start } \&1) \vee (r\delta.Q \&\Lambda_0.Q) \vee (\Delta.Q \&\text{calc\_omega}.Q);$ $\Gamma_0.E = \text{start} \vee MUX(r\delta.Q, T_{m-1}.Q \vee T'_{k-1}.Q, T_{2k+1}.Q);$ $\Gamma_i.D = \neg \text{start } \& MUX(r\delta.Q, \Gamma_{i-1}.Q, \Lambda_i.Q),$ $\Gamma_i.E = \text{start} \vee MUX(r\delta.Q, T_{m-1}.Q \vee T'_{k-1}.Q,$ $T_{(2k+1+i/n) \bmod m}.Q), i = 1, 2, \ldots, t-1.$ 17. $LL_i = \Xi_i.Q \oplus M_{i \bmod n}.Q, i = 0, 1, \ldots, t-1.$ 18. $\Lambda_0.D = MUX(\text{start}, LL_0, 1); \Lambda_i.D = \neg \text{start } \& LL_i,$ $i = 1, 2, \ldots, t-1;$ $\Lambda_i.E = \text{start} \vee T_{(2k+1+i,n)}.Q \&\neg \text{calc\_omega}.Q,$ $i = 0, 1, \ldots, t-2;$ $\text{after\_start}.D = \text{start};$ $\Lambda_{t-1}.E = \text{start} \vee (T_0.Q \&\neg \text{calc\_omega}.Q \&\neg \text{after\_start}.Q).$ 19. $\text{fail}.D = (L.Q \leq t).$ 20. $r.D = \neg \text{start } \&\neg \text{start\_omega}.Q \&(r.Q + 1);$ $r.E = \text{start} \vee T_{m-1}.Q \vee T'_{k-1}.Q.$ 21. $\text{start\_omega} D = \neg \text{start } \&(r.Q == 2*t-1) \& T_{m-2}.Q.$ 22. $\text{calc\_omega} D = \neg \text{start } \&\neg \text{finish}.Q \&(\text{start\_omega}.Q \vee$ $\text{calc\_omega}.Q).$ 23. $\Omega_i = \Gamma_{t-2-i}.Q, i = 0, 1, \ldots, t-2.$ 24. $\text{finish} D = T'_{k-1}.Q \&\neg \text{finish}.Q \&(r.Q == t-1).$ Key Equation Solver Block Scheme FIG. 1 shows the complete structure of the key equation solver block according to the embodiment of the invention described herein. As depicted in FIG. 1 (and in FIGS. 2-8 as applicable) syndromes are stored in the registers $SR_i$. Block T (FIG. 2) contains the generator for the control sequence $T_i$ that governs one iteration of the iBM algorithm. Blocks $A_i$ and $B_i$ (FIGS. 4 and 6 (and FIG. 5 for Block $B_0$) respectively) act as multiplexers, switching the inputs of the multiplier units to the proper values for the current clock cycle, as indicated by $T_i$.

Figure 3A:
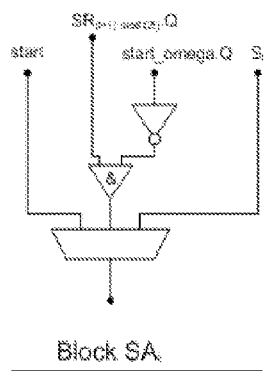
Figure 3B:
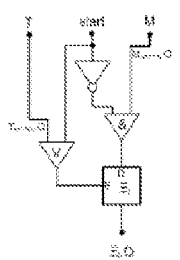
Figure 3C:
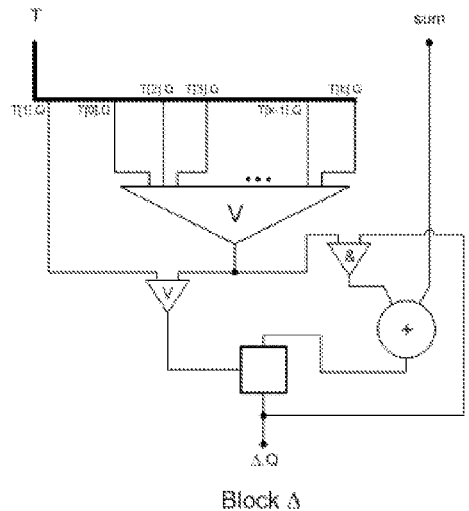

The outputs of the multiplier units are stored in the registers $M_i$. The partial results of the calculation of the new value for the error locator polynomial are stored in blocks $ACC_i$ (FIG. 3B). Coefficients for the error locator polynomial are collected in the array of registers $\Lambda_i$, and the register array $\Gamma_i$ is used to store the coefficients for the auxiliary correcting polynomial. Blocks $\Lambda\Lambda_i$ (FIGS. 7A, 7B, and 7C) and $\Gamma\Gamma_i$ (FIGS. 8A and 8B) manage the enable inputs and data inputs for $\Lambda_i$ and $\Gamma_i$ respectively, according to the state of the control sequence $T_i$. Block $\Delta$ (FIG. 3C) is used for the iterative calculation of the value $\Delta$. FIG. 3A depicts Block $SA_i$.

Block C contains logic that manages the iteration counter r, the error locator polynomial degree L, etc, and calculates the values of the signals $\Delta_{pr}$, $r\delta$, finish, fail, start_omega and calc_omega. The schematics for these modules, except for the module C, are depicted in FIGS. 2-8. The configuration of the module C follows directly from the description of its outputs in the computation scheme.

The foregoing description of preferred embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. In a key equation solver block for a processor-based BCH decoder, the improvement comprising the key equation solver block having a number of multiplier units specified by X, where:

$t*(7*t-1)/(\text{codeword\_len}-3) \leq X < (t+1),$ where t is a non-zero number of transmission errors for the key equation solver block to correct using the processor, and codeword_len is a length, greater than 3, of a transmitted codeword to be decoded by the processor-based BCH decoder.

* * * * *